(12) United States Patent
Umeda

(10) Patent No.: US 6,249,178 B1
(45) Date of Patent: Jun. 19, 2001

(54) HIGH-SPEED OUTPUT CIRCUIT DEVICE WITH A SWITCH CIRCUIT

(75) Inventor: Toshiyuki Umeda, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/154,779

(22) Filed: Sep. 17, 1998

(30) Foreign Application Priority Data

Sep. 19, 1997 (JP) .................................... 9-255732

(51) Int. Cl.$^7$ ...................................... G06G 7/12
(52) U.S. Cl. ........................ 327/563; 327/65; 330/252
(58) Field of Search ........................ 327/65–67, 563; 330/252, 253

(56) References Cited

U.S. PATENT DOCUMENTS 4,264,872 * 4/1981 Suzuki ................................. 327/65
5,221,909 * 6/1993 Cole ..................................... 330/253

FOREIGN PATENT DOCUMENTS 8-56034  2/1996 (JP) .
9-214264 8/1997 (JP) .
10-145221 5/1998 (JP) .

OTHER PUBLICATIONS

H.M. Rein et al., "A Versatile Si–Bipolar Driver Circuit with High Output Voltage Swing for External and Direct Laser Modulation in 10 Gb/s Optical–Fiber Links", IEEE Journal of Solid–State Circuits, 29(9) :1014–1021 (1994).

* cited by examiner

Primary Examiner—Kenneth B. Wells
(74) Attorney, Agent, or Firm—Finnegan, Henderson, Farabow, Garrett & Dunner, L.L.P.

(57) ABSTRACT

An output circuit device is made up of a pair of output-stage transistors, a current source, and a pair of bypass transistors. The output-stage transistors have bases for receiving differential input signals, collectors connected to a load, and emitters connected to each other. The output-stage transistors amplify the differential input signals. The current source is connected to the emitters of the differential transistors. The bypass transistors lead a transient current, which is generated at the bases as a result of the switching between the output-stage transistors, to the collectors, thereby canceling noise components generated at the collectors.

26 Claims, 6 Drawing Sheets

HIGH-SPEED OUTPUT CIRCUIT DEVICE WITH A SWITCH CIRCUIT

BACKGROUND OF THE INVENTION

The present invention relates to an output circuit device suitable for driving a low-impedance load (e.g., a laser diode) at high speed by supplying current thereto.

A circuit used for driving a laser diode for high-speed optical communication of 10 Gbps class converts a high-speed signal, whose rising time and falling time are short, into a large current output, and supplies this current to a laser diode. Therefore, the circuit requires a large-power output-stage transistor, which is large size. To attain high speed, the output stage of this circuit is formed of a differential circuit made up of a pair of transistors, and is connected to a laser diode wherein the collector of a transistor serves as a load. In other words, the circuit is of an open-collector type. The differential circuit of the output stage is driven by supplying a signal from the preceding stage thereto by way of a buffer circuit.

The paired differential transistors constituting the output-stage differential circuit switches from one to the other in response to a variation in base voltage, which is of the order of tens of mV depending upon the input signals. In order to secure a desirable noise margin, the circuit is designed such that the amplitude of an internal signal is of the order of hundreds of mV. At the time of high-speed switching, therefore, a variation in base voltage causes a voltage variation of hundreds of mV at the common emitters of the paired differential transistors of the output-stage differential circuit. When the voltage variation acts on the parasitic capacitor of the transistors of the large-sized output-stage differential circuit, transient current is produced, resulting in unstable operations.

The voltage variation at the common emitters of the paired differential transistors is fed back to the base. However, since the output impedance viewed from the base to the preceding-stage circuit is of a finite value, the voltage variation fed back to the base is amplified by the paired differential transistors once again. This phenomenon is an oscillation phenomenon occurring in a differential circuit and is generally referred to as a ringing phenomenon. The ringing phenomenon adversely affects the waveforms of the output current.

In order to cope with the ringing phenomenon, the conventional art employs an integrator circuit or the like so as to blunt the waveform of the signal supplied to the base of the paired differential transistors of the output-stage differential circuit. In other words, the rising and falling times of the signal are lengthened, and oscillation is prevented thereby. Alternatively, the output impedance of the circuit that precedes the output-stage differential circuit is set to be as low as possible, so as to suppress the ringing phenomenon.

However, the former method inevitably affects the high-speed characteristic, and the original function of the output circuit device (i.e., the function of generating a current output in response to input of a high-speed signal) is degraded. On the other hand, the latter method requires a large amount of current in the circuit, leading to increases in power consumption, the heat generation, etc.

BRIEF SUMMARY OF THE INVENTION

Accordingly, an object of the present invention is to provide an output circuit device capable of driving a low-impedance load, such as a laser diode, in a stable way, without affecting the high-speed characteristic and giving rise to an increase in power consumption.

To attain the above object, the present invention provides an output circuit device comprising: a pair of first transistors (a pair of output-stage transistors) having control electrodes connected to an input terminal and first main electrodes connected to an output terminal; and a pair of second transistors (a pair of bypass transistors) having first main electrodes connected to the control electrodes of the output-stage transistors and second main electrodes connected to the control electrodes of the output-stage transistors, a base bias of the bypass transistors being determined such that when one of the output-state transistors is ON, a corresponding one of the bypass transistors is turned on.

The present invention also provides an output circuit device comprising: a pair of differential transistors made up of two output-stage transistors whose second main electrodes are connected in common; an output-stage differential circuit including a current source which is connected to the second main electrodes of the two output-stage transistors of the differential transistors; and two bypass transistors including first and second main electrodes which are connected to the control electrode and first main electrode of the output-stage transistors, a base bias of the bypass transistor being determined such that a transistor which is one of the two bypass transistors and whose first and second main electrodes are connected to the control electrode and first main electrode of an ON-state output-stage transistor is turned on.

The output circuit device is designed such that when an output-stage transistor is on, the voltage applied between the control electrode and the first main electrode of that output-stage transistor and the voltage applied between the control electrode and the second main electrode of the same output-stage transistor are of the same polarity.

In the output circuit device of the present invention, the control electrode of the bypass transistor is connected to a constant-potential point, the potential at which is adjustable.

The output circuit device of the present invention further comprises potential adjusting means for adjusting at least one of the voltage applied to the control electrode of an output-stage transistor and the voltage applied to the first main electrode of the output-stage transistor.

The transistors employed in the present output circuit device may be either bipolar transistors or field effect transistors (FETs). In the case of a bipolar transistor, the base corresponds to a control electrode, the collector to a first main electrode, and the emitter to a second main electrode. In the case of an FET, the gate corresponds to a control electrode, the drain to a first main electrode, and the source to a second main electrode.

In the output circuit device of the present invention, noise is fed back from the emitter to the base when the output-stage transistors are switched from one to the other. A transient current, which is thereby caused at the collector, flows through the bypass transistors; it does not flow into the load connected to the output terminal. Accordingly, the ringing phenomenon is prevented.

This operation will be explained, referring to the case where the output-stage transistors are made of bipolar transistors. In this case, the collector and emitter of a bypass transistor are connected to the base and collector of an output-stage transistor, respectively. Due to this circuit configuration, the output transistor is driven in such a manner that the base-emitter transistor voltage Vbe and the base-collector voltage Vbc are of the same polarity when the output transistor is in the ON state. For example, when the output-stage transistor is an NPN transistor, the conventional output circuit device drives this transistor such that voltage Vbe is of a positive polarity and voltage Vbe is of a negative polarity. The output circuit device of the present invention, by contrast, drives the transistor such that both voltages Vbe and Vbc are both of a positive polarity.

In the case where the base bias of the bypass transistor connected to an ON-state output-stage transistor is so determined as to turn on the bypass transistor simultaneously, noise is fed back to the base from the emitter at the time of the switching between the output-stage transistors. Part of a transient current, which is caused thereby, flows through the collector-emitter path of the bypass transistor and thus reaches the collector of the output-stage transistor.

Assuming that the noise voltage fed back to the base of the output-stage transistor is Vben, the collector noise current Icn of the output-stage transistor is represented by the following formula:

$$Ic+Icn=Is \exp((Vbe+Vben)/Vt)$$

where Vbe is a base-collector bias voltage of the output-stage transistor, Ic is a collector bias current, Is is a junction saturated current, Vt is a temperature voltage, and Vt is equal to kT/q (k: Boltzmann's constant, T: absolute temperature, q: elementary charge).

If the collector noise current Icn of the output-stage transistor is equal to the current that flows from the base to the collector of the output-stage transistor by way of the collector-emitter path of the bypass transistor, the former collector noise current Icn is canceled by the latter current. As a result, the output current, which flows to the output terminal from the collector of the output-stage transistor, is free of noise components; it is made of signal components only.

To put this in other words, the collector noise current Icn of the output-stage transistor does not flow between the collector and the load connected to the output terminal; it flows by way of the bypass transistor. Since, therefore, the variation in the emitter voltage, which is due to the switching between the output-stage transistors, is not fed back to the base, and the ringing phenomenon is thus prevented, the output current does not vary in waveform.

As described above, the output circuit device of the present invention ensures reliable stability at the time of high-speed operation. Accordingly, the oscillation phenomenon, including ringing, can be suppressed, and a high-speed output current waveform, whose rising and falling times are both short, can be output.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will now be described with reference to the accompanying drawings. The embodiments will be described, referring to the case where the transistors are NPN bipolar transistors, but this in no way restricts the present invention. The NPN bipolar transistors may be replaced with PNP bipolar transistors, N-channel FETs, or P-channel FETs, if so desired.

Figure 1:
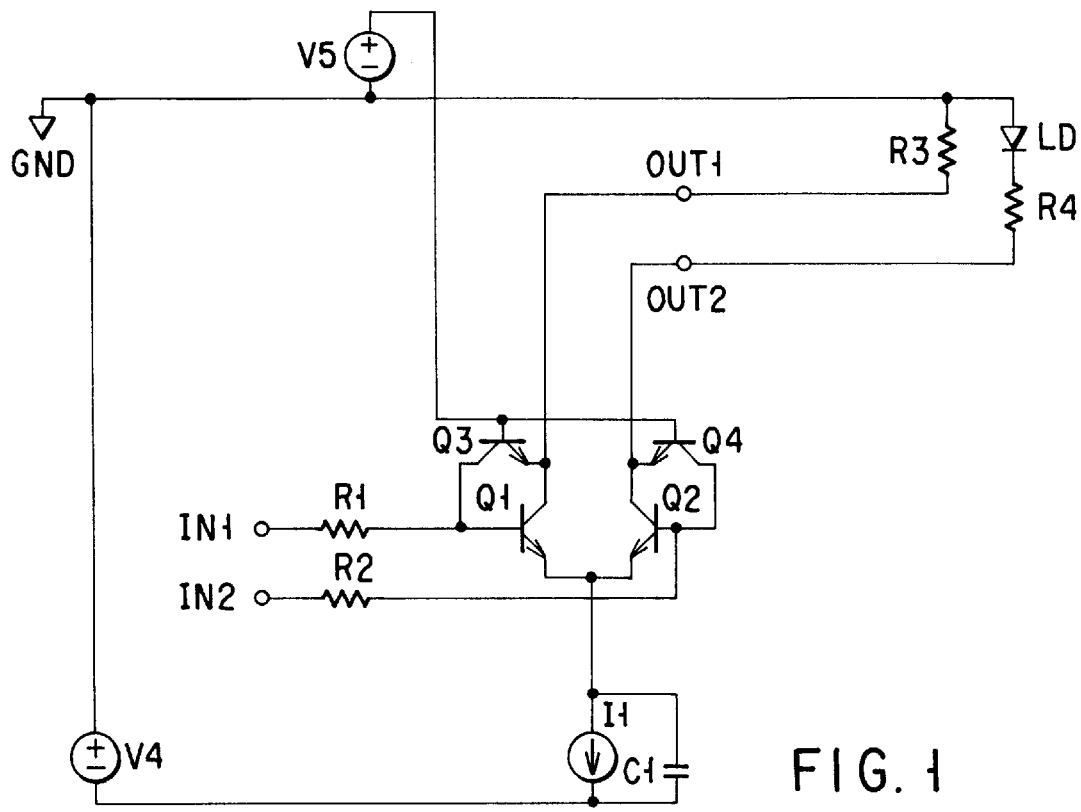
FIG. 1 is a circuit diagram showing an output circuit device according to the first embodiment of the present invention.

FIG. 1 is a circuit diagram showing an output circuit device of the first embodiment of the present invention. In FIG. 1, only the output-stage circuit is depicted, for simplicity. The output-stage circuit includes a differential transistor pair and a constant current source I1. The differential transistor pair is made up of output-stage transistors Q1 and Q2 whose emitters are connected together. The constant current source I1 is connected between the node at which the emitters of the output-stage transistors Q1 and Q2 are connected together and the low-potential side of a circuit power supply V4 (the low-potential side is a negative potential side in the case of the circuit shown in FIG. 1). The output-stage circuit amplifies differential input signals it receives at a pair of input terminals IN1 and 1N2, and outputs the amplified signals from a pair of output terminals OUT1 and OUT2. The differential input signals are, for example, high-speed pulse trains, which are on the order of several Gbps to 10 Gbps. A capacitor C1, which is connected in parallel with the constant current source I1, provides a parasitic capacitance when the constant current supply I1 is made of a transistor.

The bases of output-stage transistors Q1 and Q2 are connected to input terminals IN1 and IN2, respectively. Resistors R1 and R2 represent input impedances measured when input terminals IN1 and IN2 are viewed from the bases of the output-stage transistors Q1 and Q2. The collectors of the output-stage transistors Q1 and Q2 are connected to the output terminals OUT1 and OUT2, respectively. Output terminal OUT1 is connected in series with the high-potential side of the circuit power supply V4 by way of a terminal load resistor R3 (the high-potential side is a grounded side in the case of the circuit shown in FIG. 1. Output terminal OUT2 is connected to the high-potential side of the circuit power supply V4 by way of a terminal load resistor R4 and a laser diode LD, which serves as a load.

According to the present invention, bypass transistors Q3 and Q4 are connected to the base-collector paths of the output-stage transistors Q1 and Q2, respectively. To be more specific, the collector and emitter of bypass transistor Q3 are connected to the base and collector of output-stage transistor Q1, respectively, and the collector and emitter of bypass transistor Q4 are connected to the base and collector of output-stage transistor Q2, respectively. The bases of bypass transistors Q3 and Q4 are connected to a variable voltage source V5.

A description will now be given of the operation of the output circuit device of the embodiment.

Let us assume that between the different input signals supplied to the input terminals IN1 and IN2, the higher-level signal is at a level of Vh, and the lower-level signal is at a level of Vl. Signal amplitude Vh–Vl applied between the bases of output-stage transistor Q1 and Q2 is normally set to be 500 mV or so, in consideration of the circuit operation margin. The voltage required for output-stage transistors Q1 and Q2 from one to the other (the voltage will be hereinafter referred to as a switching threshold voltage) is represented by Vt. ln, and the value of this is 18 mV at room temperature.

By subtracting the switching threshold voltage 18 mV from one half (250 mV) of the input signal amplitude 500 mV (=Vh–Vl), 232 mV is obtained. This voltage is absorbed by variations in the emitter voltages of output-stage transistors Q1 and Q2. In other words, each time the output-stage transistors Q1 and Q2 switches from one to the other, the emitters of these transistors undergo potential variations. The transient variations in emitter potentials are more marked when the input signal is higher in speed (frequency) (i.e., when the rising time at the time of switching is shorter). The transient variations in emitter potentials also have effects on the parasitic capacitance C1 of the constant current supply I1, resulting in the generation of a transient current. The transient current at the time of switching is normally 10 mAp-p or so, though it is dependent on the value of C1 and the rising time of the input signal.

The variations in emitter potentials of output-stage transistors Q1 and Q2 are fed back to the bases thereof. Since finite impedances (resistors R1 and R2) are present when the input terminals IN1 and IN2 are viewed from the bases of transistors Q1 and Q2, the potential variations fed back to the bases of transistors Q1 and Q2 are not absorbed by input terminals Inl and IN2; they have effects on the base-emitter voltages of transistors Q1 and Q2 once again. Due to the repetition of this operation, ringing noise appears in the output waveforms at output terminals OUT1 and OUT2. The appearance of this noise is a problem occurring in the prior art output circuit device.

In order to suppress this ringing phenomenon, it is possible to use a heterobipolar transistor (HBT) since the base/collector junction potential difference and the base/emitter junction potential difference differ from each other. Where the HBT is used, the base-collector voltage and the base-emitter voltage are determined such that they fall within the ON-state saturation region of the transistor. Since, in this case, the transient current produced at the base flows toward the collector, the collector noise current Icn due to the variation in the base-emitter voltage can be compensated for. In the case of a homo-transistor, such as a silicon bipolar transistor, however, the base/collector junction potential difference and the base/emitter junction potential difference are equal to each other. Where this type of transistor is employed, the circuit system described above cannot be used for preventing the ringing phenomenon.

According to the present invention, bypass transistors Q3 and Q4 are additionally connected to output-stage transistors Q1 and Q2. With this circuit configuration, the ringing phenomenon can be suppressed by using ordinary type of homo-transistors. The principles underlying the present invention will be described below.

Let us assume that the central level Vo between the different input signals supplied to the input terminals IN1 and IN2 is the bias level. In this case, the central level Vo is expressed as Vo=(Vh+Vl)/2. When one of the output-stage transistors Q1 and Q2, for example, transistor Q1 is in the ON state, the base potential Vb1 of this transistor Q1 is Vh, the emitter potential Ve1 is (Vh–0.9V). The collector potential Vc1 of transistor Q1 can be adjusted in accordance with the bias level Vo. In the present explanation, the collector potential Vc1 is determined to be 0.2V lower than the base potential Vb1. When the collector potential Vc1 is determined in this manner, the collector-emitter voltage Vce1 of transistor Q1 is 0.7V or so. On the other hand, the collector-emitter voltage Vce2 of transistor Q3 connected to transistor Q1 is 0.2V.

The base potential Vb3 of bypass transistor Q3 can be adjusted by means of the variable voltage source V5. In order to turn on bypass transistor Q3 when output-stage transistor Q1, to which transistor Q3 is connected, is in the ON state, the variable voltage source Q3 is operated in such a manner that the base potential Vb3 of transistor Q3 is 0.9V higher than the collector potential Vc1 of output-stage transistor Q1. That is:

$$Vb3 = Vc1 + 0.9$$
$$= (Vb1 - 0.2) + 0.9$$
$$= Vh( = Vb1) + 0.7$$

The other output-stage transistor Q2 and bypass transistor Q4 connected thereto are applied with voltages in a similar manner to that described in the preceding paragraph.

By the bias level adjustment described above, the output-stage transistors Q1 and Q2 operate in the active regions. When the output-stage transistors Q1 and Q2 switch from one to the other, variations in emitter potential are fed back to the bases, and noise currents are produced thereby at the collectors. However, these noise currents do not flow to the load, since the transient currents produced at the bases at the time of switching pass through the bypass transistors Q3 and Q4 and flow into the collectors of output-stage transistors Q1 and Q2, thereby canceling the noise currents produced at the collectors. In this manner, the ringing phenomenon, which is a problem in the prior art output circuit device, can be prevented. Since variations in the collector currents of output-stage transistors Q1 and Q2, as viewed from the output terminals OUT1 and OUT2, can be eliminated, the laser diode LD, which serves as a load, can be supplied with a current having a waveform faithful to the waveforms of the different input signals supplied to the input terminals IN1 and IN2.

The advantages of the present invention will now be described, referring to specific experimental data.

Figure 2:
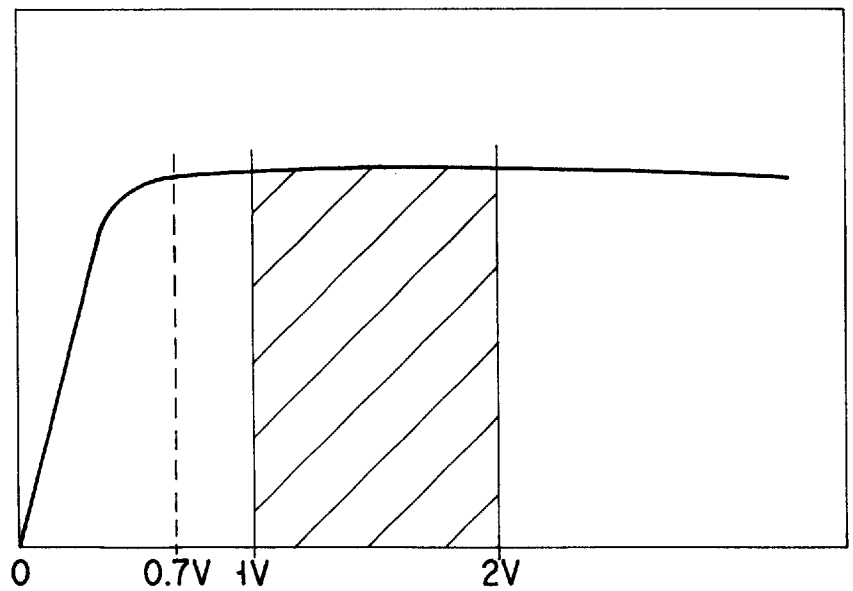
FIG. 2 is a graph showing the operation regions of the transistors of the output-stage differential circuits of the output circuit devices of the present invention and the prior art.

FIG. 2 is a graph illustrating the operating bias state of the output-stage transistors Q1 and Q2. In the graph, the relationships between the collector-emitter voltage and the collector current are set forth. In the present embodiment, the collector-emitter voltage is 0.7V or so. Although this voltage is lower than the normally-employed voltage (the range of which is indicated by oblique lines in FIG. 2) by 1V to 2V, it is in the active region nonetheless. It can therefore be understood that the device of the present invention is not used in the saturated region.

Figure 3:
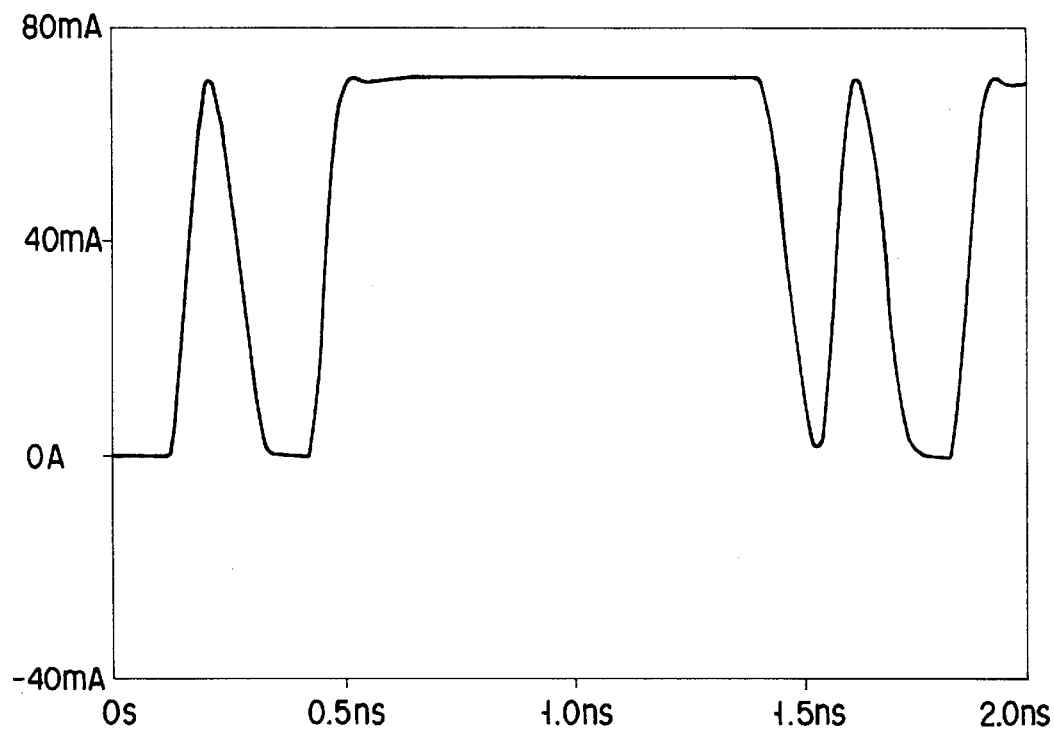
FIG. 3 is a graph showing an output current waveform of the output circuit device of the first embodiment.

FIG. 3 is a graph showing how a signal output current from the output circuit device of the first embodiment varies with time. As is apparent from FIG. 3, the waveform of the signal output current is free of oscillation, such as ringing, and provides a satisfactory rectangular wave.

Figure 4:
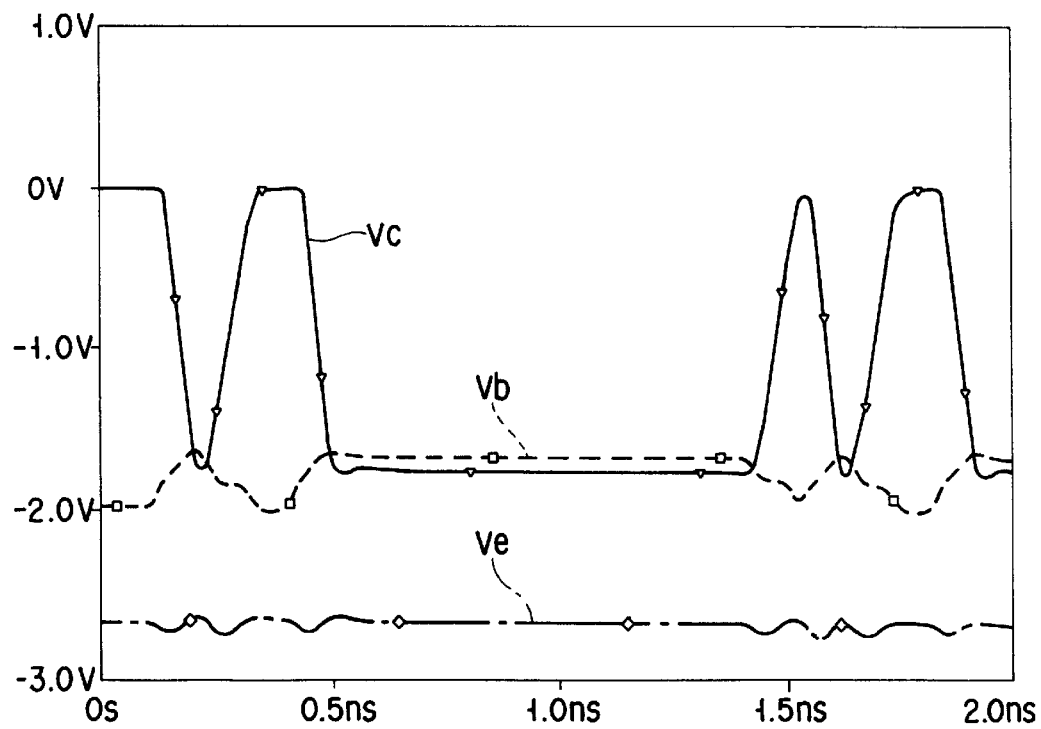
FIG. 4 is a graph showing how the collector, base and emitter potentials vary with time in an output-stage transistor employed in the output circuit device according to the embodiment.

FIG. 4 is a graph showing how the collector potential Vc, base potential Vb and emitter potential Ve of output-stage transistors Q1 and Q2 vary with time. As can be seen from FIG. 4, in the ON state of the output-stage transistor Q1 or Q2, the collector potential Vc is lower than the base potential Vb by 0.2V or so, but the collector-emitter voltage Vce remains 0.7V or so. It can therefore be understood that the device is in the active region.

Figure 5:
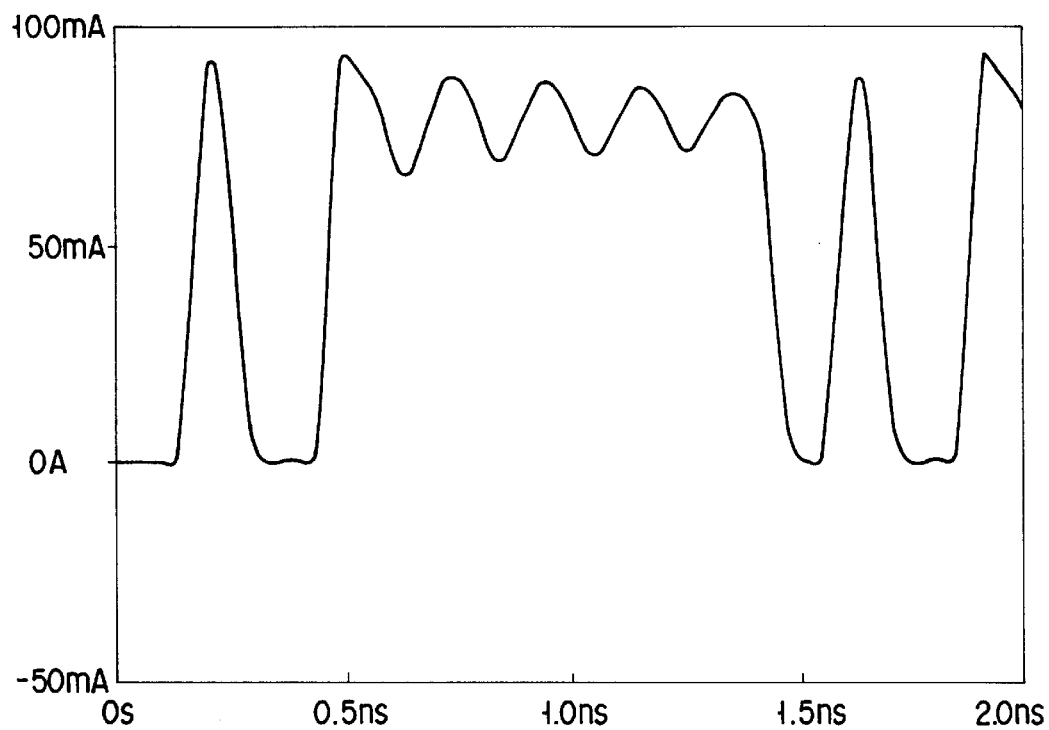
FIG. 5 is a graph showing an output current waveform of the output circuit device of a comparative output circuit device.
Figure 6:
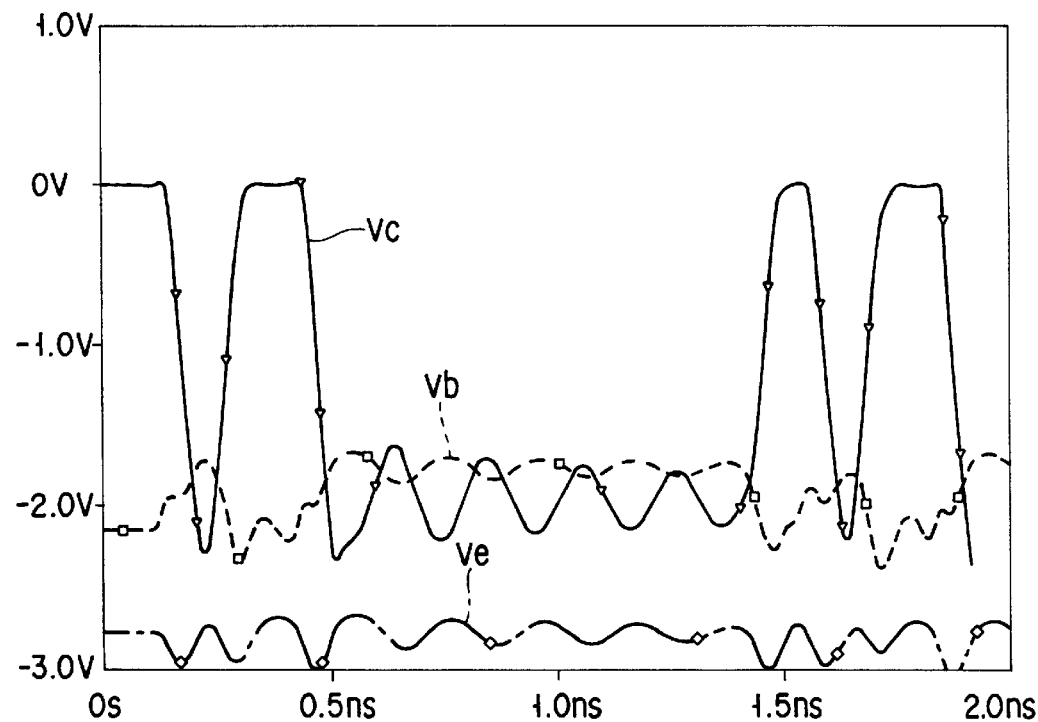
FIG. 6 is a graph showing how the collector, base and emitter potentials vary with time in an output-stage transistor employed in the comparative output circuit device.

FIG. 5 illustrates the case of a conventional output circuit device which does not employ such bypass transistors Q3, Q4 as are depicted in FIG. 1. FIG. 5 is a graph showing how a signal output current varies with time when the conventional output circuit device is operated under a similar bias condition to that of the present invention. Measurement was made as to how, in the output-stage transistors Q1 and Q2, the collector potential Vc, base potential Vb and emitter potential Ve varied with time at the time. The results of the measurement are shown in FIG. 6.

As shown in FIG. 5, the waveform of the signal output current includes not only an intrinsic rectangular waveform but also a large-amplitude continuous oscillatory waveform. This indicates the occurrence of ringing. At the time, the collector potential Vc is lower than the base potential Vb, as shown in FIG. 6. However, since no bypass transistor is employed, current does not flow from the bases of transistors Q1 and Q2 to the collectors thereof, and the base potential is varying at all times.

To put this in other words, in the conventional output circuit device (which does not comprise bypass transistor Q3 or Q4), the base-emitter voltage Vbe of the ON-state one of output-stage transistors Q1 and Q2 is 0.9V, provided that the transistor is a silicon bipolar transistor. The base-collector voltage Vbc of this transistor is slightly varied depending upon the loads (e.g., terminal load resistors R3 and R4 and laser diode LD) connected to the output terminals OUT1 and OUT2, but the collector potential Vc is normally higher than the base potential Vb during use (i.e., Vbc<0). This indicates that the transistor is in the active bias region and thus operates in the constant current supply condition. In this condition, a stable current output is obtained, but the noise due to ringing is amplified in accordance with the gain of the transistor, thus producing a collector current. Hence, a reliable high-speed operation cannot be expected.

In the output circuit device of the present embodiment, the collector and emitter of bypass transistor Q3 are connected to the base and collector of output-stage transistor Q1, respectively. Likewise, the collector and emitter of bypass transistor Q4 are connected to the base and collector of output-stage transistor Q2, respectively. With this circuit configuration, when the output-stage transistors Q1 and Q2 are ON, the base-emitter voltage Vbe and the base-collector voltage Vbc are of the same polarity.

When output-stage transistor Q1 is in the ON state, bypass transistor Q3 is turned on. Likewise, when output-stage transistor Q2 is in the ON state, bypass transistor Q4 is turned on. At the time of switching between output-stage transistors Q1 and Q2, a transient current is produced due to the noise fed back from the emitters to bases of transistors Q1 and Q2, and the transient current partially flows into the collectors of transistors Q1 and Q2 after passing through the emitter-collector paths of bypass transistors Q3 and Q4.

In the manner described above, the variations in emitter potential caused at the time of the switching between output-stage transistors Q1 and Q2 are fed back to the bases. Due to this feature, if the current that flows from the bases to the collectors of transistors Q1 and Q2 by way of the collector-emitter paths of the bypass transistors Q3 and Q4 is equal in amount to the noise current generated at the collectors of transistors Q1 and Q2, the former current cancels the latter noise current. As a result, the output current flowing from the collectors of output-stage transistors Q1 and Q2 to the output terminals OUT1 and OUT2 is purely a signal current and does not contain noise components. In this manner, the ringing phenomenon, which is due to the variations in emitter potential caused at the time of the switching between the output-stage transistors Q1 and Q2 and fed back to the bases, is prevented by providing the bypass transistors Q3 and Q4. Therefore, variations in the output current waveform, which arise from the ringing phenomenon, can be suppressed or prevented.

As described, the output circuit device of the embodiment can prevent unstable phenomena, such as ringing, even when a laser diode or another type of load is supplied with current for driving at high speed. Therefore, the load can be supplied with a signal output current of reliable rectangular wave.

In the prior art, a signal waveform is blunted by means of an integrating circuit so as to prevent the occurrence of ringing. Since the present invention does not have to perform such an operation, the high-speed characteristic is not affected.

Figure 7:
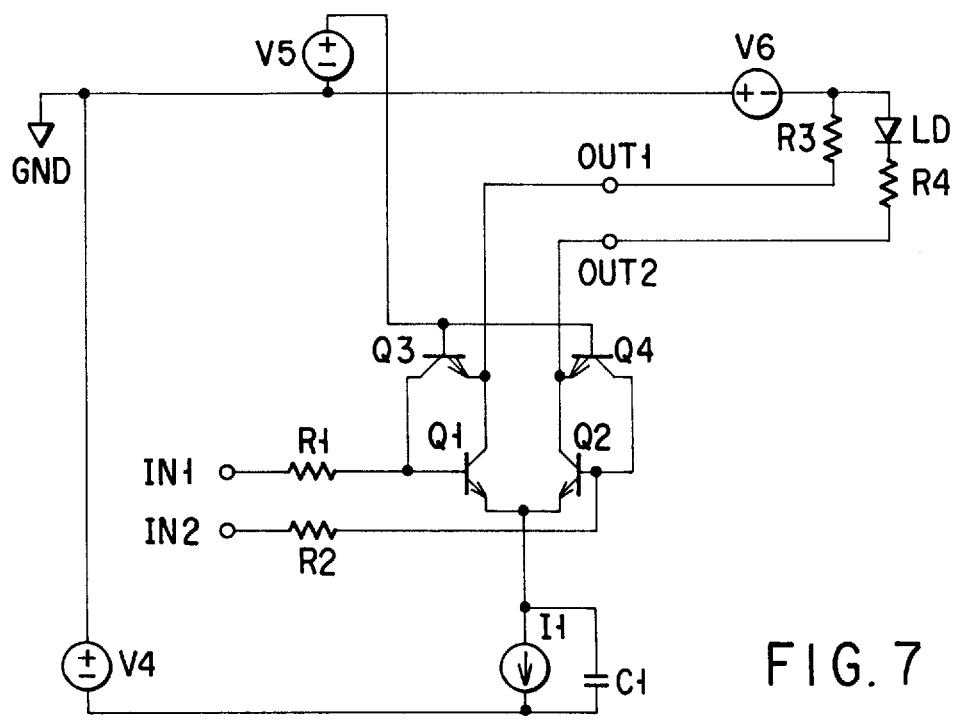
FIG. 7 is a circuit diagram showing an output circuit device according to the second embodiment of the present invention.

FIG. 7 is a circuit diagram of an output circuit device according to the second embodiment of the present invention. The second embodiment differs from the first embodiment in that a variable voltage source V6 is inserted in the grounding line by means of which loads, such as terminal load resistors and a laser diode LD, are grounded (the loads being connected to the collectors of output-stage transistors Q1 and Q2 by way of output terminals OUT1 and OUT2).

According to the second embodiment, the potential at the grounding line led from the terminal load resistors R3 and R4 and the laser diode LD (i.e., the potential at the collectors of transistors Q1 and Q2) can be arbitrarily controlled by adjusting the voltage applied by the variable-voltage source V6. Since the collector potential of the output-stage transistors Q1 and Q2 can therefore be adjusted in an arbitrary manner, optimal bias to the transistors Q1 and Q2 can be maintained even if load variations occurs in the output circuit device.

Figure 8:
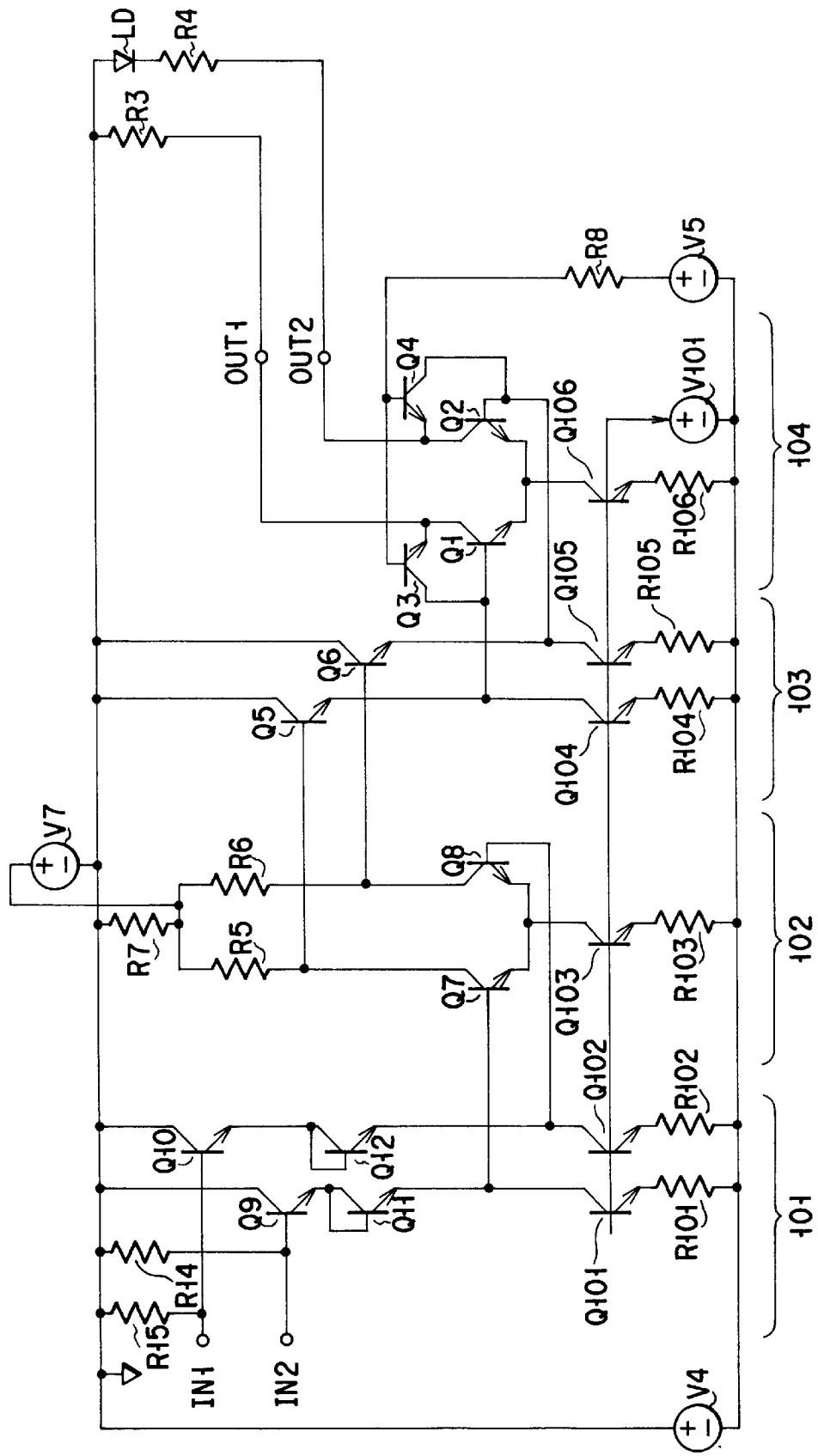
FIG. 8 is a circuit diagram showing an output circuit device according to the third embodiment of the present invention.

FIG. 8 shows an output circuit device according to the third embodiment of the present invention. The third embodiment provides a circuit including a two-stage differential amplifier circuit. The differential amplifier circuit connected to the input terminal of the output-stage differential amplifier circuit is made up of transistors Q1 and Q2, and the base bias level of these transistors can be adjusted.

To be more specific, differential input signals received at input terminals IN1 and IN2 are first supplied to an input buffer circuit 101. This input buffer circuit 101 has an emitter follower configuration and is made up of: transistors Q9 and Q10, level-shifting transistors Q11 and Q12 of diode connection; and a constant current source including transistors Q101 and Q102 and resistors R101 and R102. Through the input buffer circuit, the different input signals enter a first-stage (pre-stage) differential amplifier circuit 102.

The pre-stage differential amplifier circuit 102 is made up of: a differential transistor pair including transistors Q7 and Q8 whose emitters are connected together; a constant current source including transistor Q103 and resistor R103 (transistor Q103 is connected to both the common emitter of transistors Q7 and Q8 and the lower-potential side [the negative potential side in FIG. 8] of a circuit power supply V5); load resistors R5 and R6 connected at one end to the collectors of transistors Q7 and Q8; and a level-shifting resistor R7 connected between the other ends of the load resistors R5 and R6 and the higher-potential side (grounded side) of the circuit power source V5. A variable voltage source V7 is connected to a node at which the load resistors R5 and R6 and the level-shifting resistor R7 are connected to each other.

An inter-stage buffer circuit 103 is connected to the collectors of transistors Q7 and Q8 (the collectors serve as the output terminals of the pre-stage differential amplifier circuit 102). The inter-stage buffer circuit 103 lowers the signal level and output impedance of an output signal of the pre-stage differential amplifier circuit 102 to a predetermined degree and supplies the resultant signal to an output-stage differential circuit 104. The inter-stage buffer circuit 103 is made of an emitter follower including transistors and constant current sources (which serve as emitter loads of the transistors).

To be more specific, the collector output of transistor Q7 of the pre-stage differential circuit 102 enters the emitter follower made up of transistor Q5, transistor Q104 (which is connected to both the emitter of transistor Q5 and the lower-potential side [negative potential side] of the circuit power supply V5), and resistor R104. After passing through this emitter follower, the collector output of transistor Q7 is supplied to the base of transistor Q1 of the output-stage differential circuit 104.

Likewise, the collector output of transistor Q8 of the pre-stage differential circuit 102 enters the emitter follower made up of transistor Q6, transistor Q105 (which is connected to both the emitter of transistor Q6 and the lower-potential side of the circuit power supply V5), and resistor R105. After passing through this emitter follower, the collector output of transistor Q8 is supplied to the base of transistor Q2 of the output-stage differential circuit 104.

The level-shifting resistor R7 provided in the pre-stage differential amplifier circuit 102 shifts the potential level into a negative value. To be specific, the potential at those ends of load resistors R5 and R6 which are connected to the circuit power supply V1 (i.e., the grounded ends of load resistors R5 and R6) is shifted to have a negative level. The effects of this level shifting are transmitted through the inter-stage buffer circuit 103 to the output-stage differential circuit 104, wherein the base potentials of output-stage transistors Q1 and Q2 are shifted to have negative levels. Hence, the level shifting degree of the level shift resistor R7 can be controlled, and the base bias levels of output-stage transistors Q1 and Q2 can therefore be controlled, by adjusting the level of the voltage applied by the variable voltage source V7. Even if the collector potentials of output-stage transistors Q1 and Q2 vary as a result of changes in the output condition of the output circuit device, the optimal bias condition of the transistors Q1 and Q2 can be maintained by making adjustment by means of the variable voltage source V7.

Figure 9:
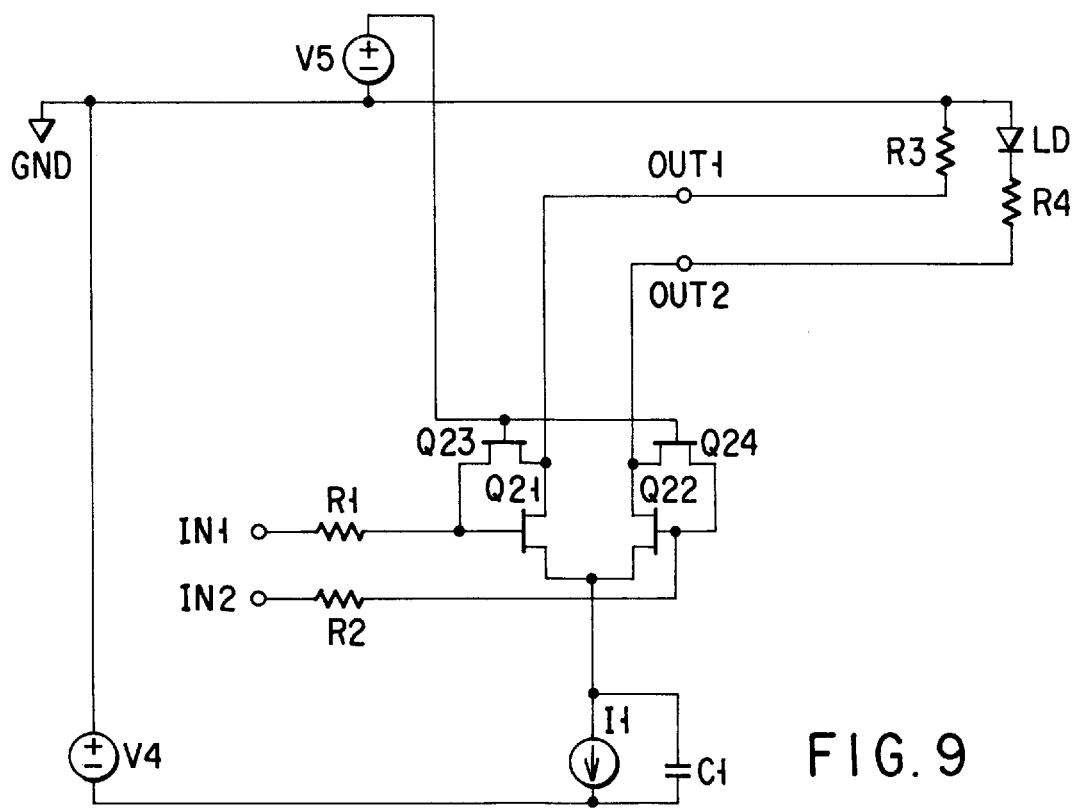
FIG. 9 is a circuit diagram showing an output circuit device according to the fourth embodiment of the present invention.

In the second embodiment described above, the transistors employed in the output circuit device are NPN bipolar transistors. Needless to say, however, they may be PNP bipolar transistors. Moreover, an output circuit device of the present invention may employ FETs, as in the fourth embodiment shown in FIG. 9. In the fourth embodiment shown in FIG. 9, field effect transistors (FETs) Q21, Q22, Q23 and Q24 are employed, in place of transistors Q1, Q2, Q3 and Q4 used in the output circuit device of the first embodiment shown in FIG. 1. The advantages of the output circuit device employing FETs are similar to those of the output circuit devices of the foregoing embodiments.

Figure 10:
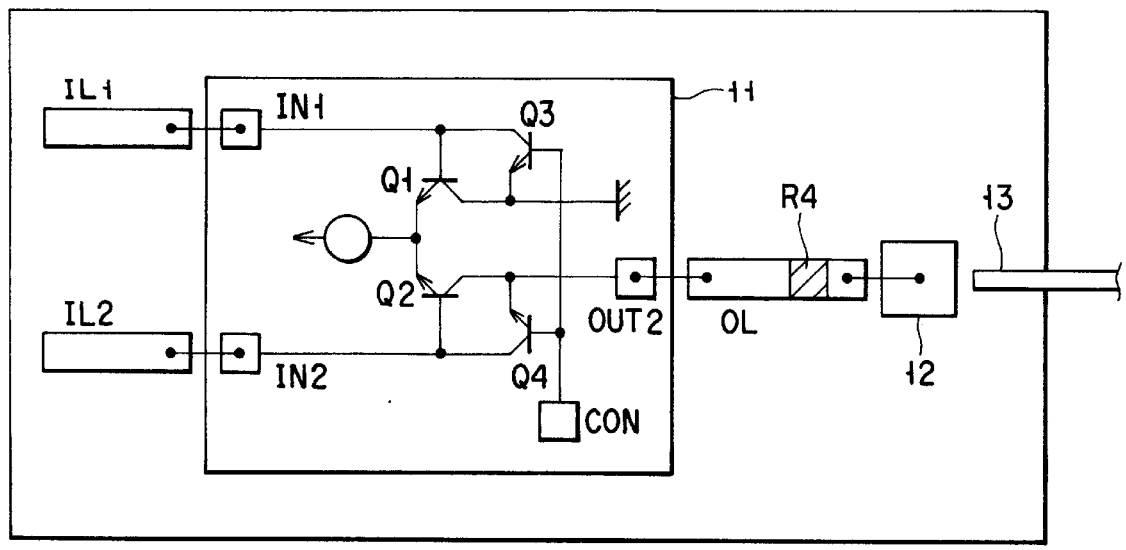
FIG. 10 is a diagram showing an LD module to which an output circuit of the present invention is applied.

FIG. 10 shows an LD (laser diode) module to which the output circuit described above is applied. In the LD module, the input pads IN1 and IN2 of an IC (integrated circuit) chip 11, in which an output circuit is incorporated, are connected to input lines IL1 and IL2, respectively. The output pad OUT2 of the IC chip 11 is connected to an output line OL. A terminating resistor R4 is connected to an end of the output line OL, and the output line OL is connected to an LD (laser diode) chip 12 by way of the terminating resistor R4. A variable power supply VS is connected to a control pad CON, provided on the IC chip 11.

The LD module described above operates as follows. High-speed pulses, supplied to the input pads IN1 and IN2 by way of the input lines IL1 and IL2, are amplified by the output circuit. Owing to the operation of the bypass transistors Q3 and Q4, the signal output current produced from the output circuit has a waveform that does not include oscillation components caused by ringing. The signal output current is supplied to the LD chip 12 as a driving current, after passing through the output line OL and terminating resistor R4. As a result, the laser diode of the LD chip 12 is driven, and a laser beam is output to a fiber 13.

Figure 11:
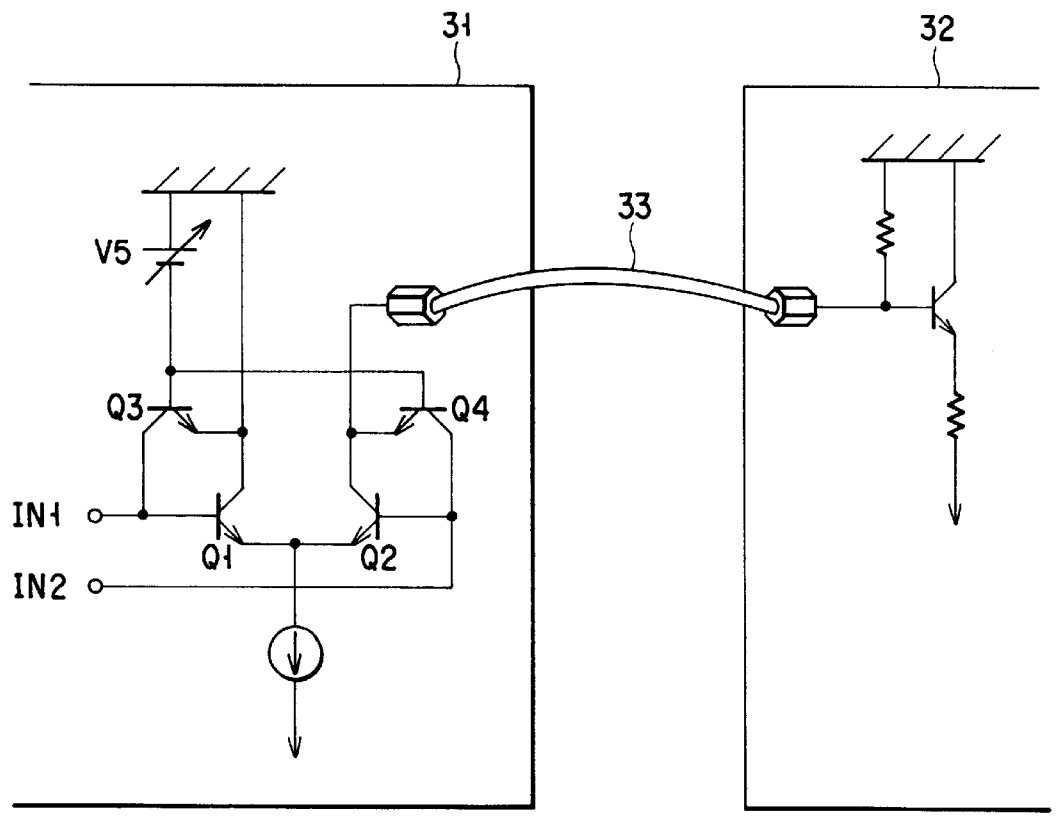
FIG. 11 is a diagram showing a high-speed interference to which an output circuit of the present invention is applied.

FIG. 11 shows a high-speed interface to which the output circuit described above is applied. Referring to FIG. 11, an output-side apparatus 31, in which the output circuit of the present invention is incorporated, and a load-side apparatus 32 are connected by means of a transmission cable 33. In this high-speed interface, the output-side apparatus 31 generates an output signal that is free of oscillation components caused by ringing, and transmits this signal to the transmission cable 33. Through this transmission cable 33, the output signal is supplied to the load-side apparatus 32.

Only the bypass transistor Q4 may be used which is connected to the output-stage transistor Q2 connected to the laser diode LD. In other words, the bypass transistor Q3 may be omitted.

In the embodiments described above, the output-stage circuit and the circuit connected to the input terminal of that output-stage circuit are made of differential circuits. However, this in no way restricts the present invention. For example, the present invention is applicable to an output circuit device whose output stage includes a single transistor.

When the present invention is reduced to practice, the variable voltage source V6 described in connection with the second embodiment and the variable voltage source V7 described in connection with the third embodiment may be used in combination. In this case, the output circuit device can be designed such that both the collector and base potentials of transistors Q1 and Q2 of the output-stage differential circuit 101 are adjustable. In addition, the means for adjusting the collector and base potentials of the transistors Q1 and Q2 are not limited to the variable voltage sources V6 and V7 shown in FIGS. 7 and 8.

As described above in detail, according to the present invention, bypass transistors are employed in combination with the output-stage transistors. When one of the output-stage transistors is ON, the bypass transistor connected thereto is also turned on. Accordingly, it is possible to provide an output circuit device capable of generating an output current waveform not adversely affected by ringing or the like, without affecting the high-speed characteristic and giving rise to an increase in the power consumption. The output circuit device of the present invention is suitable for use as a driver circuit for driving a low-impedance load requiring a high-speed operation, such as a laser diode used for high-speed optical communication.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An output circuit device comprising:
   a pair of output-stage transistors having control electrodes for receiving differential input signals, first main electrodes connected to a load, and second main electrodes connected to each other, said output-stage transistors being in ON and OFF states, respectively, in accordance with the differential input signals;
   a current source connected to the second main electrodes of the output-stage transistors; and
   a switch circuit connected to the output-stage transistors and configured to make switches interposed between the control electrodes and the first main electrodes turn ON and OFF, respectively, in accordance with the differential input signals and lead a current generated from the control electrodes to a corresponding one of the first main electrodes in accordance with the ON and OFF states of the output-stage transistors.

2. An output circuit device according to claim 1, wherein:
   said output-stage transistors are a pair of first transistors including bases serving as the control electrodes, collectors serving as the first main electrodes, and emitters serving as the second main electrodes; and
   said switch circuit includes a pair of second transistors having emitters connected to the collectors of the first transistors, respectively collectors connected to the bases of the first transistors, respectively, said switch circuit also including a power supply connected to the bases of the second transistors and configured to drive the second transistors so that a voltage on the collectors of the output-stage transistors is lower than a voltage on the bases of the output-stage transistors.

3. An output circuit device according to claim 2, wherein, when the first transistors are in ON and OFF states, respectively, said power supply biases the bases of the second transistors to make the second transistors in ON and OFF states respectively in correspondence with the ON and OFF states of the first transistors.

4. An output circuit device according to claim 2, wherein said power supply drives the second transistors such that when one of the first transistors is in an ON state, a corresponding one of the second transistors is in an ON state to lead a current from the base of the one of the first transistors to the collector thereof through the corresponding one of the second transistors which is in the ON state, and when a remaining one of the first transistors is in the ON state, a corresponding remaining one of the second transistors is in an ON state to lead a current from the base of the remaining one of the first transistors to the collector thereof through the corresponding remaining one of the second transistors which is in the ON state.

5. An output circuit device according to claim 2, further comprising an additional variable voltage source which varies potentials at the collectors of the first transistors, thereby enabling collector potentials of the first transistors to be adjusted in an arbitrary manner.

6. An output circuit device according to claim 1, wherein:
   said output-stage transistors are a pair of first field effect transistors including gates serving as the control electrodes, drains serving as the first main electrodes, and sources serving as the second, main electrodes; and
   said switch circuit includes a pair of second field effect transistors having sources connected to the drains of the first transistors, respectively, drains connected to the gates of the first transistors, respectively, and gates, said switch circuit also including a voltage supply connected to the gates of the second field effect transistors to drive the second transistors so that a voltage on the drains of the output stage transistors is lower than a voltage on the gates of the output-stage transistors.

7. An output circuit device according to claim 2, wherein said power supply comprises a variable power supply.

8. An output circuit device according to claim 6, wherein said power supply comprises a variable power supply.

9. An output circuit device comprising:
   a first transistor having a control electrode connected to an input terminal, a first main electrode connected to an output terminal, and a second main electrode;
   a second transistor having a first main electrode and a second main electrode which are connected to the control electrode and the first main electrode of the first transistor, respectively; and
   a bias circuit configured to bias the second transistor such that the second transistor is in an ON state when the first transistor is in an ON state to lead a current from the control electrode of the first transistor to the first main electrode thereof through the second transistor and in an OFF state when the first transistor is in an OFF state, wherein said bias circuit includes a circuit power source configured to apply a bias voltage to the second transistor such that a voltage applied between the control electrode and the first main electrode of the first transistor and a voltage applied between the control electrode and the second main electrode of the first transistor are of an equal polarity when the first transistor is in an ON state.

10. An output circuit device according to claim 9, wherein said bias circuit includes a circuit power source configured to apply a bias voltage to the second transistor such that a voltage applied between the control electrode and the first main electrode of the first transistor and a voltage applied between the control electrode and the second main electrode of the first transistor are of an equal polarity when the first transistor is in an ON state.

11. An output circuit device according to claim 9, wherein said drive circuit includes a variable voltage source configured to apply to the control electrode of the second transistor a constant voltage whose level is adjusted.

12. An output circuit device according to claim 9, further comprising a potential adjusting circuit configured to adjust at least one of the potentials of the control electrode and first main electrode of the first transistor.

13. An output circuit device according to claim 12, wherein said potential adjusting circuit includes a variable voltage source connected to the first main electrode of the first transistor by way of a load.

14. An output circuit device according to claim 12, wherein said potential adjusting circuit includes a variable voltage source which applies a variable bias voltage to the control electrode of the first transistor.

15. An output circuit device comprising:
an output-stage differential circuit including two output-stage transistors having control electrodes for receiving differential input signals, respective first main electrodes connected to a load, and respective second main electrodes connected to each other, said output-stage differential circuit also including a current source connected to the second main electrodes of the output-stage transistors, said output stage transistors being in ON and OFF states, respectively, in accordance with the differential input signals;
two switching transistors including respective first main electrodes connected to the control electrodes of the output-stage transistors, respectively, and respective second main electrodes connected to the first main electrodes of the output-stage transistors, respectively; and
a drive circuit configured to drive the switching transistors for making the switching transistors in ON and OFF states, respectively, in correspondence with the ON and OFF states of the output-stage transistors.

16. An output circuit device according to claim 15, wherein said drive circuit includes a circuit power source configured to apply a bias voltage to the switching transistors for making the switching transistors in ON and OFF states, respectively, such that a voltage applied between the control electrode and the first main electrode of one of the output-stage transistors and a voltage applied between the control electrodes and the second main electrodes of the output-stage transistors are of an equal polarity when said one of the output-stage transistors is in an ON state.

17. An output circuit device according to claim 15, wherein said switching circuit includes a variable voltage source configured to apply to the control electrodes of the switching transistors a constant voltage whose level is adjusted.

18. An output circuit device according to claim 15, further comprising a potential adjusting circuit configured to adjust at least one of potentials of the control electrodes and main electrodes of the output-stage transistors.

19. An output circuit device according to claim 18, wherein said potential adjusting circuit includes a variable voltage source connected to the first main electrodes of the output-stage transistors by way of the load.

20. An output circuit device according to claim 18, wherein said potential adjusting circuit includes a variable voltage circuit configured to apply a variable bias voltage to the control electrodes of the output-stage transistors.

21. An output circuit device comprising: an output-stage differential circuit including two output-stage transistors, each having first main electrodes connected to a load, and second main terminals connected to each other, said output-stage differential circuit also including a current source connected to the second main electrodes of the output-stage transistors;
two bypass transistor circuits, each including first main electrodes connected to the control electrodes of the output-stage transistors, and second main electrodes connected to the first main electrodes of the output-stage transistors; and
an input-stage differential circuit configured to be supplied with a differential input signal for adjusting a base bias level of the output stage transistors,
said input-stage differential circuit setting the base bias level of the output stage transistors such that when one of the two bypass transistors is in an ON state, the first and second main electrodes thereof are respectively connected to the control electrode and the first main electrode of one of the two output-stage transistors which is also in an ON state.

22. An output circuit device according to claim 21, wherein said input-stage differential circuit includes: a pair of differential transistors whose emitters are connected to each other; a constant current source connected to a node at which the emitters of the differential transistors are connected to each other; a pair of load resistors which are connected at one end to collectors of the differential transistors; and
a level-shifting resistor connected between the other ends of the load resistors and a high-potential electrode of a circuit power supply.

23. An output circuit device comprising:
an output-stage differential circuit including two output-stage transistors having respective first main electrodes one of which is connected to a main load and respective second main electrodes connected to each other, said output-stage differential circuit also including a current source connected to the second main electrodes of the output-stage transistors;
a bypass transistor including a first main electrode connected to the control electrode of one of the output-stage transistors which has the first main electrode connected to the main load, and a second main electrode connected to the first main electrode of said one of the output-stage transistors; and
an input-stage differential circuit for adjusting a base bias level of said bypass transistor such that said bypass transistor is in an ON state when said one of the two output-stage transistors is in an ON state.

24. An output circuit device comprising:
a pair of output-stage transistors having bases receiving differential input signals, collectors connected to a load, and emitters connected to each other, said output-stage transistors amplifying the differential input signals;
a current source connected to the emitters of the output stage transistors; and
a bypass circuit configured to lead a current from the bases to the collectors due to switching between the output-stage transistors to the collectors, to thereby cancel noise components generated at the collectors, said bypass circuit including a pair of second transistors having emitters connected to the collectors of the first transistors, collectors connected to the bases of the first transistors, and bases, and said bypass circuit also including a variable power supply connected to the bases of the second transistors; and
said output circuit device further comprising an additional variable voltage source which varies potentials at the collectors of the second transistors, thereby enabling collector potentials of the first transistors to be adjusted in an arbitrary manner.

25. An interface apparatus comprising:

a pair of input lines;

an IC (integrated circuit) chip in which an output circuit is incorporated, the IC chip having input terminals connected to the input lines, respectively, and an output pad;

an output line connected to the output pad of the IC chip;

a laser diode chip; and a terminating resistor connected to an end of the output line to connect the output line to the laser diode chip; and wherein the output circuit includes:

a pair of output-stage transistors having control electrodes for receiving differential input signals, first main electrodes connected to a load, and second main electrodes connected to each other, said output-stage transistors being in ON and OFF states, respectively, in accordance with the differential input signals;

a current source connected to the second main electrodes of the output-stage transistors; and a pair of switching transistors configured to turn ON and OFF respectively in accordance with the ON and OFF states of the output-stage transistors and lead a current alternately from the control electrodes of the output-stage transistors to a corresponding one of the first main electrodes of the output-stage transistors through one of the switching transistors which is in an ON state in accordance with the ON and OFF states of the output-stage transistors.

26. An interface apparatus comprising:

an output side unit incorporating an output circuit;

a load-side unit; and a transmission cable connecting the output-side unit to the load-side unit, wherein the output circuit includes:

a pair of output-stage transistors having control electrodes receiving differential input signals, first main electrodes connected to a load, and second main electrodes connected to each other, said output-stage transistors being in ON and OFF states, respectively, in accordance with the differential input signals;

a current source connected to the second main electrodes of the output-stage transistors; and a pair of switching transistors configured to turn ON and OFF respectively in accordance with the ON and OFF states of the output-stage transistors and lead a current alternately from the control electrodes of the output-stage transistors to a corresponding one of the first main electrodes of the output-stage transistors through one of the switching transistors which is in an ON state in accordance with the ON and OFF states of the output-stage transistors.

\* \* \* \* \*

UNITED STATES PATENT AND TRADEMARK OFFICE
CERTIFICATE OF CORRECTION

PATENT NO. : 6,249,178 B1 Page 1 of 1
DATED : June 19, 2001
INVENTOR(S) : Toshiyuki Umeda It is certified that error appears in the above-identified patent and that said Letters Patent is hereby corrected as shown below:

Column 11,
Line 50, after "respectively", insert a comma (-- , --).

Signed and Sealed this

Third day of September, 2002

Attest:

JAMES E. ROGAN
Attesting Officer  Director of the United States Patent and Trademark Office